(12) United States Patent
Mirov et al.

(10) Patent No.: US 7,514,937 B2
(45) Date of Patent: Apr. 7, 2009

(54) METHOD AND APPARATUS FOR INTERCONNECT DIAGNOSIS

(75) Inventors: Russell N. Mirov, Los Altos, CA (US); Howard L. Davidson, San Carlos, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 25 days.

(21) Appl. No.: 11/284,354

(22) Filed: Nov. 21, 2005

(65) Prior Publication Data
US 2007/0115004 A1 May 24, 2007

(51) Int. Cl.
*G01R 31/04* (2006.01)
*G01R 31/08* (2006.01)

(52) U.S. Cl. .................. 324/538; 324/519; 324/527

(58) Field of Classification Search .............. 324/538, 324/519, 527
See application file for complete search history.

(56) References Cited

U.S. PATENT DOCUMENTS

| | | | | |
|---|---|---|---|---|
| 5,363,048 | A * | 11/1994 | Modlin et al. ............... | 324/519 |
| 5,486,753 | A | 1/1996 | Khazam et al. | |
| 6,104,198 | A | 8/2000 | Brooks | |
| 6,933,730 | B2 * | 8/2005 | Parker et al. ............... | 324/538 |
| 6,960,917 | B2 * | 11/2005 | Parker et al. ............... | 324/538 |
| 6,984,991 | B2 * | 1/2006 | Bond et al. ................ | 324/538 |
| 7,075,307 | B1 * | 7/2006 | Williamson ................ | 324/519 |
| 2004/0164755 | A1 | 8/2004 | Yamaoka et al. | |
| 2006/0123289 | A1 * | 6/2006 | Williams .................. | 714/724 |

FOREIGN PATENT DOCUMENTS

| | | |
|---|---|---|
| EP | 0 805 356 | 11/1997 |
| GB | 2143954 | 2/1985 |
| GB | 2 405 215 | 2/2005 |
| JP | 2001201753 | 7/2001 |
| WO | WO 02/082109 | 10/2002 |
| WO | WO 2004/025315 | 3/2004 |

OTHER PUBLICATIONS

Combined Search and Examination Report under Sections 17 and 18(3), Application No. GB 0503641.3, Jul. 18, 2005, 6 pages.
International Search Report Application No. PCT/US2006/061153 mailed May 2, 2007.
Written Opinion Application No. PCT/US2006/061153 mailed May 2, 2007/.

* cited by examiner

*Primary Examiner*—Timothy J Dole
(74) *Attorney, Agent, or Firm*—Meyertons Hood Kivlin Kowert & Goetzel, P.C.; Rory D. Rankin

(57) ABSTRACT

A system configured to detect faults in signal lines. A system includes a first component configured to communicate with a second component via a signal path including one or more signal traces. Sense signal lines are manufactured such that at some point they are in close proximity to a signal trace which is to be monitored. The sense signal lines are configured to use parasitic coupling to redirect a portion of a signal conveyed via a signal trace to a monitoring component. The first component is configured to convey a test signal indicative of a type of test via the signal path, and a reference signal to the monitoring component. The monitoring component is configured to utilize the reference signal to ascertain a presence or absence, or characteristics of a received redirected signal. The monitoring component may optionally utilize a locally generated reference signal.

17 Claims, 10 Drawing Sheets

METHOD AND APPARATUS FOR INTERCONNECT DIAGNOSIS

BACKGROUND

1. Field of the Invention

This invention is related to the field of signal transmission paths and, more particularly, to diagnosing interconnect faults.

2. Description of the Related Art

Computing systems and components typically have numerous communication paths which must remain operable for the system as a whole to operate correctly. Such communication paths occur within given assemblies (e.g., a single printed circuit board, device, or chip), and across such assemblies as well. For example, multiple boards may be coupled to communicate via connectors. When an error is detected, identifying the location of a fault can be quite difficult. A fault could be due to a short, a failure of a trace line, a faulty connector, and so on. Often times, a service engineer may not be able to isolate the location of such a fault and may simply attempt to correct the problem via trial and error. For example, the engineer may first replace an entire printed circuit board. After replacing the board, further tests may be run to determine whether the fault has been corrected. If the fault has not been corrected, further testing must generally be performed. As may be appreciated, such an approach is fairly inefficient, costly, and may lead to increased downtime for a customer. In addition to the above, systems and assemblies are typically tested prior to being approved for distribution or sale. During such testing, it is similarly desirable that the location of a given fault be identified in an efficient and cost effective manner.

FIG. 1 depicts one embodiment of a system 100 which includes a variety of components and multiple communication paths, or channels. In the example shown, system 100 includes a printed circuit board (or device package) 110 which includes a chip or board 120. Chip 120 may, for example, be mounted upon board 110. In such a case, there may exist an interface 122 between the chip 120 and the board 110. In addition, or alternatively, chip 120 may comprise a packaged device manufactured to include a ball grid array, or any other suitable technology. Also illustrated is a device 130 which is not located directly on the board 110. Alternatives emodiments may include both of devices 130 and 140 on a single card or board. Device 130 is coupled to communicate with chip 120 via signal lines 112 and 114. Signal lines 112 and 114 may comprise PCB traces, or any other suitable transmission paths. In the embodiment shown, device 130 connects to board 110 via a connector 180. Through the connector 180, the device 130 is able to communication with the device 120.

Should the system 100 fail, or otherwise indicate an error, a fault in communication within the system 100 may be the cause. Unfortunately, determining a location of the fault may be very difficult. The fault could reside within device 130, or within device 120. Alternatively, a defect may exists in one of the signal line 112 or 114 between device 130 and connector 180. Further, the fault may exist within the connector 180, or between the connector 180 and the device 120. Still further, a fault may exist in a solder joint 122 which connects device 120 to board 130. Consequently, while it may be possible to determine that a problem exists, the location of a given fault cannot be determined without additional information. In some cases, the determination as to where a fault may exist is based upon past experience, or probabilities. However, such approaches do not provide any certainty.

Accordingly, a method and mechanism for determining a location of a fault in a transmission path is desired.

SUMMARY

Methods and mechanisms for detecting and diagnosing faults on signal paths are contemplated.

In one embodiment, additional points of visibility are added to functional signal lines of a system. Additional points of visibility may be created by adding sense lines in close proximity to functional trace lines which are to be monitored. Using parasitic coupling between the sense lines and functional traces, a small portion of the functional signal may be redirected to a monitoring device. Based upon the characteristics of the signal detected by the monitoring device, the location of a fault may be determined, or otherwise narrowed to a particular region.

In one embodiment, a system includes a first component configured to communicate with a second component via a signal path including one or more signal traces. Sense signal lines are manufactured such that at some point they are in close proximity to a signal trace which is to be monitored. The sense signal lines are configured to use parasitic coupling to redirect a portion of a signal conveyed via a signal trace to a monitoring component. The first component is configured to convey a test signal indicative of a type of test via the signal path, and a reference signal to the monitoring component. The monitoring component is configured to utilize the reference signal to ascertain a presence or absence, or characteristics of a received redirected signal.

In a further embodiment, the monitoring component is configured to receive a redirected portion of a test signal via a sense signal line, multiply the redirected portion with a reference frequency to produce a resulting signal, filter the resulting signal to obtain a filtered signal, and detect an amplitude of the filtered signal. Still further, in one embodiment, the second component is configured to encode a transmitted test signal with a pseudo random noise code prior to transmitting the test signal. The monitoring component is then configured to receive a redirected portion of the encoded test signal, and utilize a replica of the pseudo noise code to extract components of the test signal from the redirected portion of the encoded test signal. Such extracted components may include amplitude, phase, frequency, time of arrival, or otherwise. In addition, monitoring components may be provided which are configured to generate a reference signal locally rather than receiving the reference signal from an external source.

These and other embodiments are contemplated and will be appreciated upon reference to the following description and drawings.

BRIEF DESCRIPTION OF THE DRAWINGS

The following detailed description makes reference to the accompanying drawings, which are now briefly described.

Figure 1:
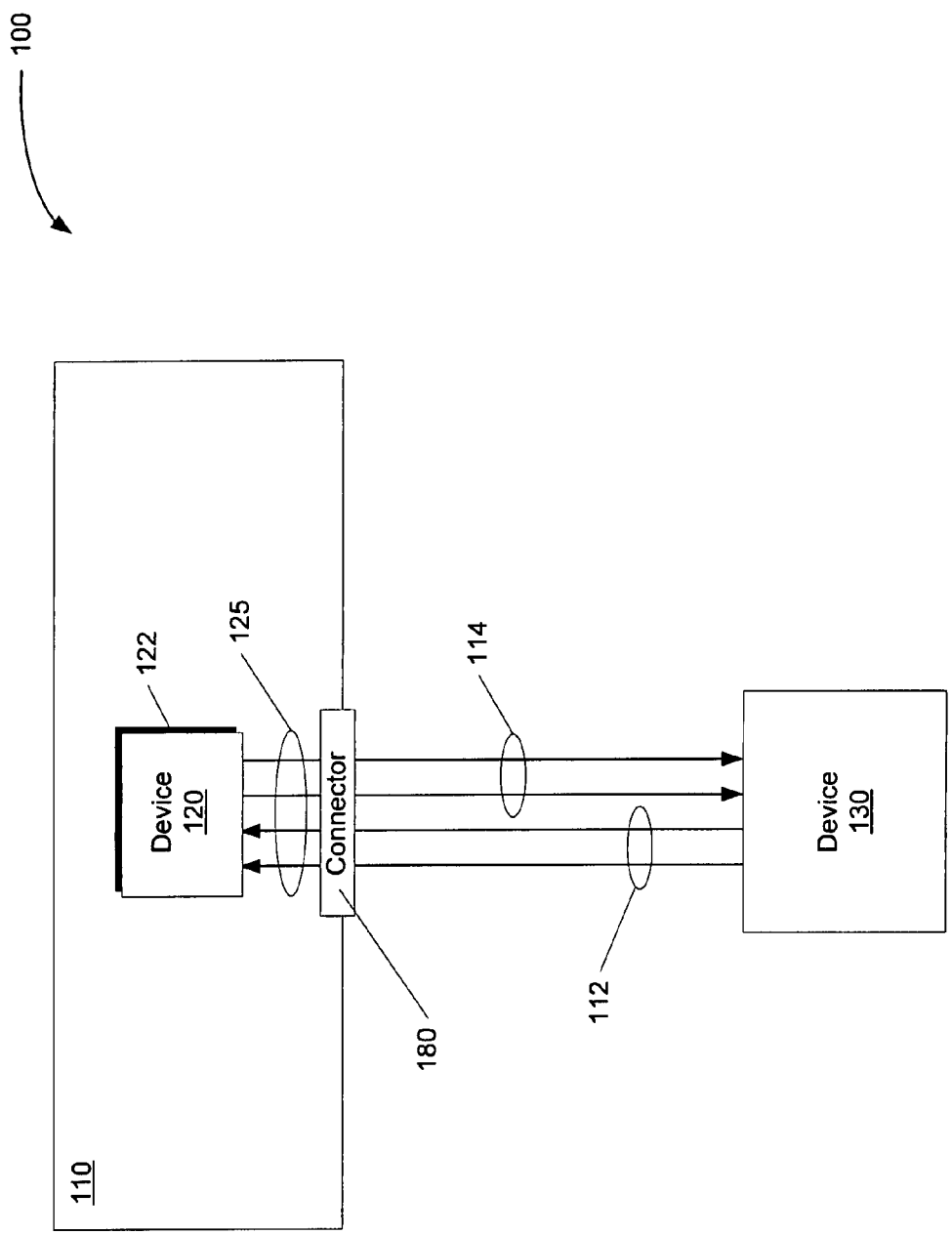
FIG. 1 is a block diagram illustrating one embodiment of a system with devices coupled to communicate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 2:
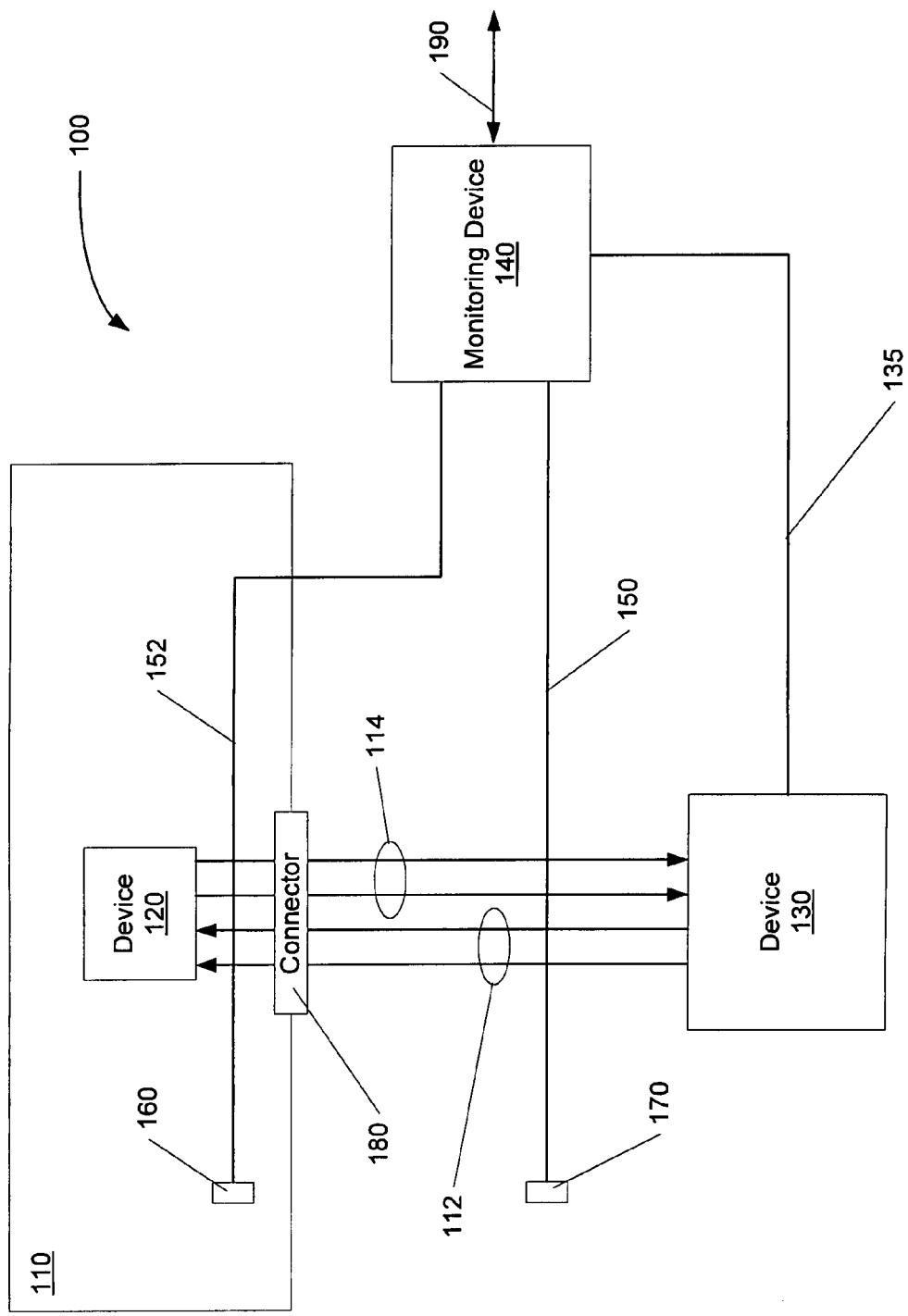
FIG. 2 is a block diagram illustrating one embodiment of a system including a monitoring device.

Turning now to FIG. 2, one embodiment of a system configured to provide additional information concerning the location of a in the event of failure is illustrated. Generally speaking, system 100 of FIG. 2 has been modified by adding additional receivers to the signal network. The manner in which the additional receiver is added is configured to have minimal (and controlled) impact on signal integrity and timing. FIG. 2 includes components similar to those of FIG. 1, which are similarly numbered. In addition, the system 100 of FIG. 2 includes a component 140 (e.g., an instrumentation device) which is configured to monitor communications between components 120 and 130. It is noted that component 140 may also be configured to monitor other signals and components than those which are shown. Each of the components depicted in FIG. 2 may be part of a single chip and/or package, or a larger interconnected system.

In the example shown, component 140 includes a signal sense line 150 coupled to trace lines 112 and 114, and signal sense line 152 coupled to trace lines 112 and 114. Component 140 may further include a bus or signal lines 190 for use in configuring operation of the component 140 and/or reading signal and related information which are being monitored, or stored data corresponding to tests which have been conducted. Such a bus 190 may comprise an I²C, SPI, or any other suitable type of bus. In addition, each of the signal sense lines 150 and 152 may be terminated via terminators 160 and 170. Such termination may, for example, be configured to match the impedance of the respective sense signal line in order to reduce reflected signals or other signal artifacts which may be unwanted. In other embodiments, such termination may not be required. In addition to the above, system 100 of FIG. 2 may include a test signal reference 135 coupled between component 130 and component 140. As will be discussed below, test signal reference 135 may be utilized during a test procedure for use during testing to compare a signal transmitted via paths 112 and/or 114, and a signal detected by sense lines 150 or 152.

Generally speaking, sense lines 150 and 152 are routed in close proximity (e.g., over, under, or near) to functional signal paths 112 and 114. Via coupling (e.g., capacitive or inductive), some portion of the signal conveyed via paths 112 and 114 may be sensed by the respective sense line which is in close proximity. When a fault is suspected, an identifiable test signal may be driven onto a line (e.g., wire) of the functional paths (112, 114). The nature of the signal being conveyed may be indicated to component 140 via reference signal 135. Sense lines 150 and/or 152 may then detect the test signal (via capacitive coupling), and convey the detected signal to component 140. Component 140 may be configured to detect the presence, and possible the phase, of the test signal. By using measurements from component 140, it may be possible to determine how far along the signal path (112, 114) the test signal has propagated before it fails to arrive at its intended destination. For example, if a test signal conveyed from component 130 to component 120 is detected by sense line 150, but not sense line 152, this may indicate the fault is within connector 180 or somewhere one board 110. In this manner, faults due to opens (e.g., bad connectors, broken traces, etc.) may be diagnosed. In addition, a location of an electrical fault causing unexpected signal degradation may be diagnosed. It is noted that any suitable type of test signal may be utilized. For example, in one embodiment, the test signal may comprise a single frequency, pseudo-noise, a waveform of complex harmonic content, or otherwise.

In one embodiment, component 140 is configured to discriminate and detect the test signal applied to one or more lines of collection of signals 112 and 114. The coupling method employed may result in a very small signal at the sense inputs to component 140. Accordingly, various embodiments may utilize both gain and selectivity.

In one embodiment, a heterodyne mixing and narrowband amplitude detection are utilized. Generally speaking, the driving device (120 or 130) transmits a signal of a known frequency onto each functional line (112, 114), one at a time. The test signal will propagate down the functional path and will either arrive at the intended destination uncorrupted (in the case of no fault) or it will be interrupted or degraded by a fault. In either case, the signal will also couple to the sense lines 150, 152 and be applied as inputs to component 140. Component 140 may then be configured to pass these inputs through a bandpass filter and gain stage prior to multiplication (mixing) by a reference frequency (local oscillator). The resulting product will contain mixer products (e.g., sum, difference, beat) that can be selectively filtered (intermediate frequencies) and further amplified before amplitude detection. Component 140 may utilize analog and/or digital methods to perform this down conversion and selection that are well understood by those skilled in the art. The output of the amplitude detector can then be converted into a number that represents the signal strength, and this value can be provided over the bus 190 to automatic diagnostic processes.

In various embodiments, signal paths 112 and 114 may generally carry very high bandwidth signals. The test signal which is utilized may have a similar bandwidth, but such is not a requirement. For example, in one embodiment, the test signal with low bandwidth or amplitude may be conveyed while the system is operational. Whichever the case, it is important that the coupling method used and the sense lines 150, 152 support the bandwidth. In various embodiments, termination devices 160 and 170 may be required at the end of signal sense lines 150 and 152 in order to maintain signal integrity. The coupling method which is used to extract information from paths 112 and 114 may have large path loss and may take many forms. The large path loss may be desirable so that a relatively large percentage of the test signal arrives at its intended destination, and only a small fraction of the test signal is diverted to component 140. Such an approach may be used to avoid an adverse signal integrity impact on the function signals (112, 114).

Figure 3:
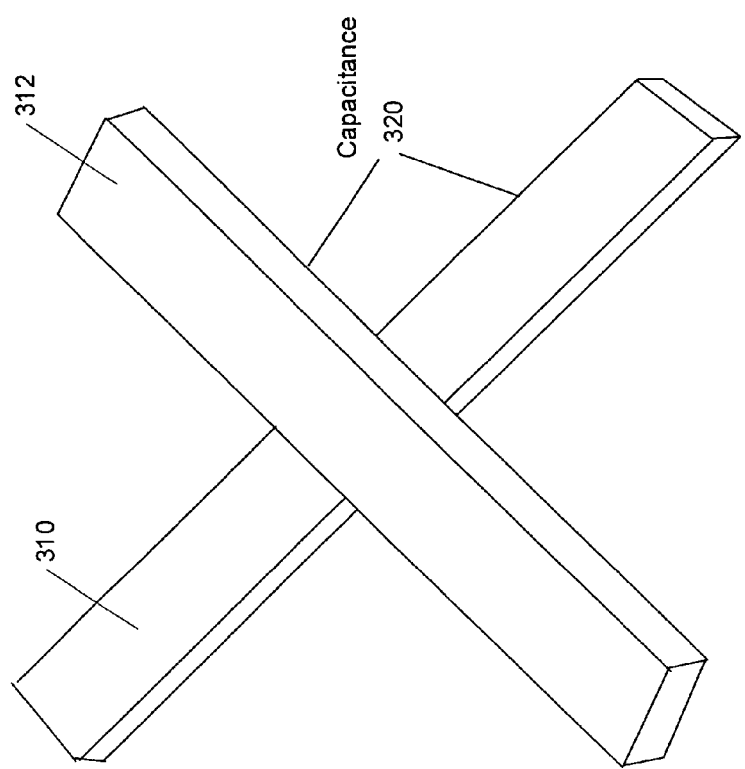
FIG. 3 depicts one embodiment of electromagnetic coupling between a signal path and sense signal line.

Sense lines 150 and 152 may be coupled to paths 112 and 114 in a number of ways. FIG. 3 illustrates one embodiment as to how a signal line may be coupled to a sense line. In the example show, a sense line 312 is illustrated as crossing over a functional trace 310. Generally speaking, coupling may be mostly due to capacitance 320 between the lines 310 and 312. The amount of capacitance 320 may be related to the size of the area of overlap between the lines 310 and 312, the dielectric constant of any material (e.g., printed circuit board) separating the lines 310 and 312, and the distance between the lines 310 and 312. It is noted that as used herein, "functional trace" may be used to refer to primary signaling paths and/or sense signal lines. Generally speaking, the primary signaling paths and sense signal lines may be considered part of the same network.

Figure 4:
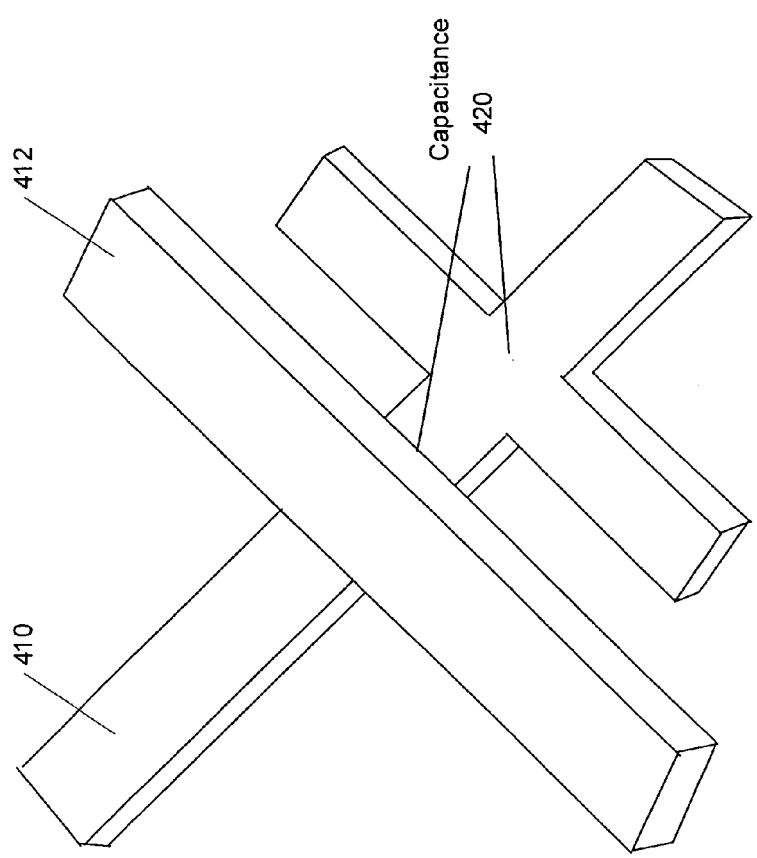
FIG. 4 illustrates one embodiment of a sense signal line configured to increase electromagnetic coupling with a signal path.

In order to increase coupling between a functional line and a sense line, an approach such as that shown in FIG. 4 may be utilized. FIG. 4 also depicts an embodiment wherein a sense line 410 crosses under a functional trace 412. As before, capacitance 420 may exists between the sense line 410 and trace 412. However, in this case, an effort has been made to increase the coupling between lines 410 and 412 by increasing the area of overlap between the lines 410 and 412. In particular, at the point where sense line 410 crosses under trace 412, sense line 410 has been "distorted" or "extended" to increase the region of overlap between the lines. This increase in the area of overlap may in turn increase the capacitive coupling between the lines 410 and 412, and may serve to improve low frequency response and signal to noise ratio of the signal diverted to a component such as component 140.

Figure 5A:
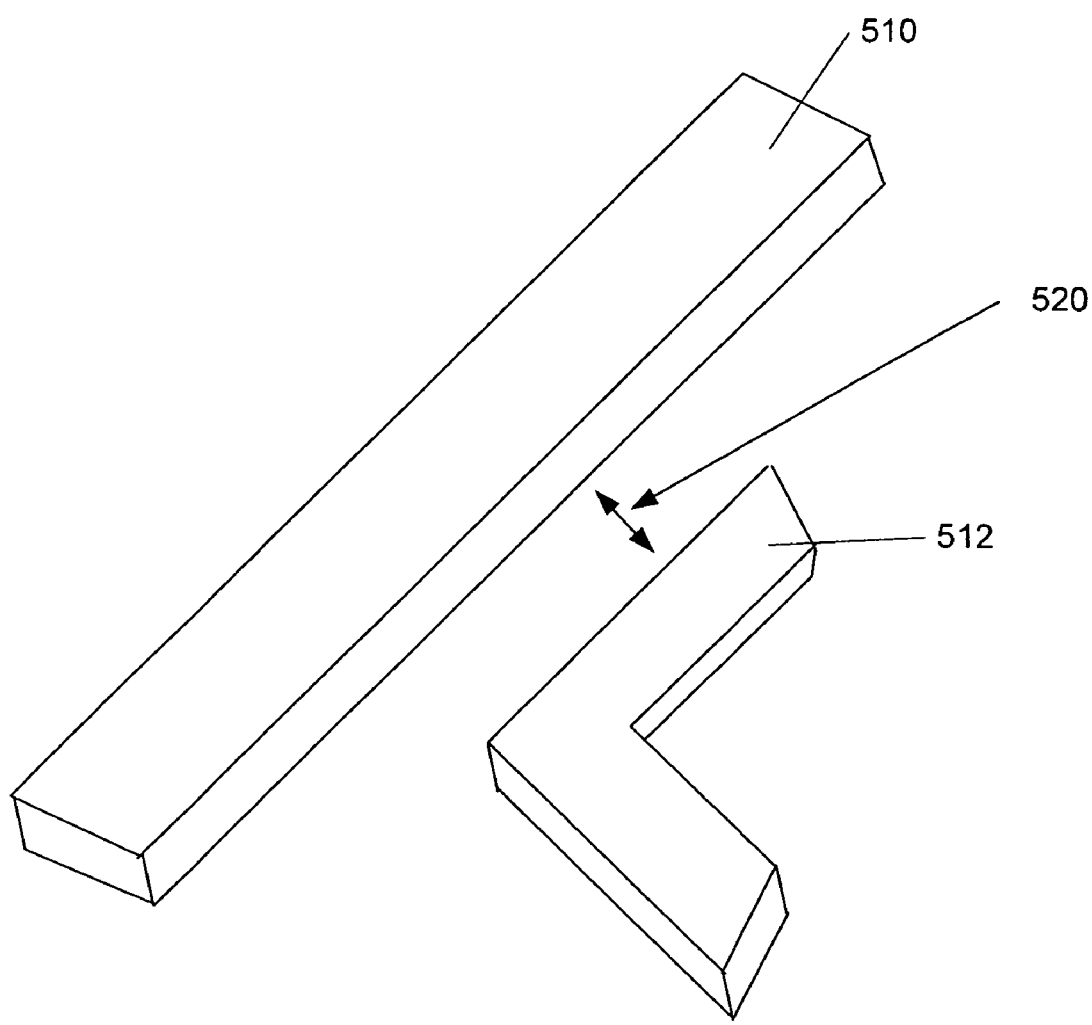
FIG. 5A illustrates electromagnetic coupling between coplanar signal lines.
Figure 5B:
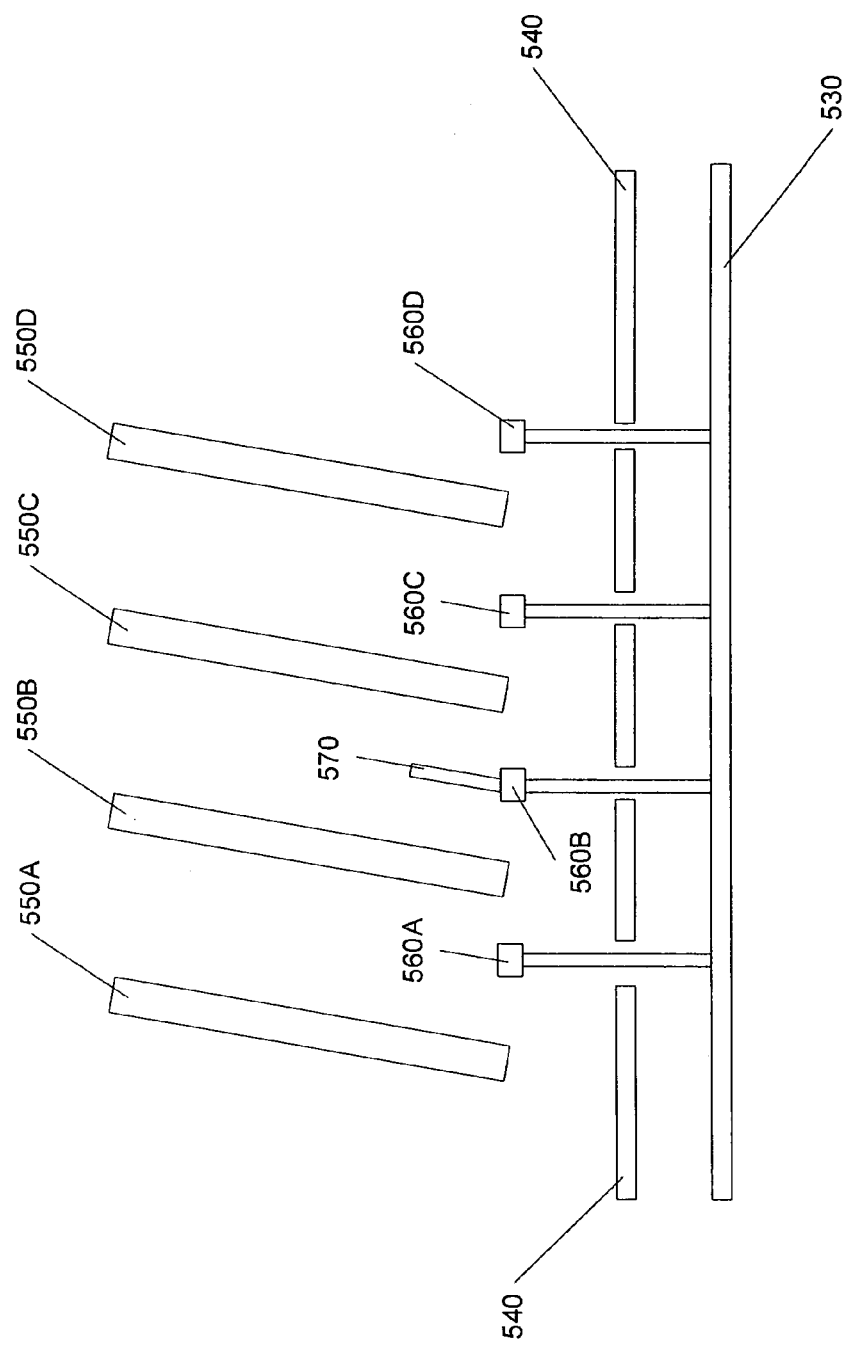
FIG. 5B illustrates vias rising through a ground plane near high speed signals.

In addition to the above, other approaches to coupling are possible as well. FIG. 5A depicts an embodiment wherein a sense signal 512 is manufactured on a same plane as a functional signal trance 510. In this example, sense signal 512 may be manufactured to run parallel to a trace line 510 for some distance in order to increase capacitive coupling 520. Numerous such alternatives are possible and are contemplated.

It is noted that in high speed paths, the signal integrity of the high speed paths may be adversely impacted by having a sense trace routed directly underneath. Often it is required that directly underneath the signal paths there must be a ground (or reference) plane. FIG. 5A depicts a cross section of one embodiment wherein the needs of the high speed signal path may be met (i.e. By having a ground plane underneath), while providing coupling to a sense trace. In the example shown, a sense trace 530 is shown with a series of vias 560A-560D rising up through a ground plane 540. Also shown are high speed signal traces 550A-550D which are placed above the ground plane 540 and near the vias 560. In the embodiment shown, there is no physical contact between the paths 550 and the vias 560. The placement and geometries of the trace and via features may be selected to provide the desired amount of coupling. For example, the second via 560B from the left shows an example of a via with additional trace 570 added to increase coupling.

In an alternative embodiment, spread spectrum signaling and detection may be utilized. This approach may provide for improved process gain and selectivity, and may have the additional benefit of yielding absolute phase information. There are a number of well known spread spectrum signaling methods, including direct sequence, frequency hopping, and frequency chirp. Each has its own unique benefit, and may be selected by the designer as the circumstances of the application are reviewed. All have the characteristic that a signal reference must be generated or captured and temporally aligned with the inputs as part of the correlation process.

For example, in a direct sequence system a pseudo noise code is used to encode the transmitted signal. Component 140 may then use a locally generated replica of the pseudo noise code, or alternatively receive it via signal line 135, and a correlator to measure signal strength. Such a correlator may be tuned for particular codes and may be relatively immune to artificial noise or interference. In this manner, the detected signal may be efficiently extracted.

As noted above, a reference signal (e.g., pseudo noise code) can be provided to component 140 as a discrete input 135, or it can be generated internally, or it can be inferred through cross-correlation of the multiple inputs of component 140. The general steps in the process may resemble those of the heterodyne mixing approach, with the substitution of the generated/recovered spread spectrum reference for the local oscillator at the mixer. Note that the mixer need not be an analog device, it may be a digital multiplier or single logic gate (AND, XOR) if suitable signal conversion is employed to the sense inputs.

Although the discussion above describe two sense inputs to component 140, it is to be understood that any number of sense inputs may be used. Using more sense lines may serve to resolve the location of a fault to a smaller region of the system. In addition, while the above description describes driving a single test signal onto at most one line at a time so that the automatic process knows in advance where the signal detected is coming from, selectivity can be achieved in other ways. For example, it is possible to drive each line with a unique frequency (in the case of the heterodyne mixing approach) or spreading signal (in the case of the spread spectrum approach) and have those signals all arrive at the inputs to the component 140 without detection ambiguity. For example, rather than single lines (112, 114) as depicted, paths 112 and 114 may comprise buses with multiple lines. Signal sense lines 150 and 152 may also comprise buses with multiple lines. Numerous such alternatives are possible and are contemplated.

In addition, the physical locations and quantities of component 140 need not be as described above. Rather, the functionality of component 140 may be integrated into component 120 and/or 130, or another device which is not shown. In addition, component 140 may aggregate the sensing functions of many sense lines and high speed paths. Sense lines 150 and 152 may be expanded to include regions on a chip, package, or interconnect. Further, the system does not need to employ physical partitions or modules. Still further, the signaling topology for paths 112 and 114 may have more than one driver and receiver. Also, the test signals injected onto paths 112 and 114 do not need to employ the same electrical signaling scheme, bit rate, or physical pins as the primary functional paths.

Figure 6:
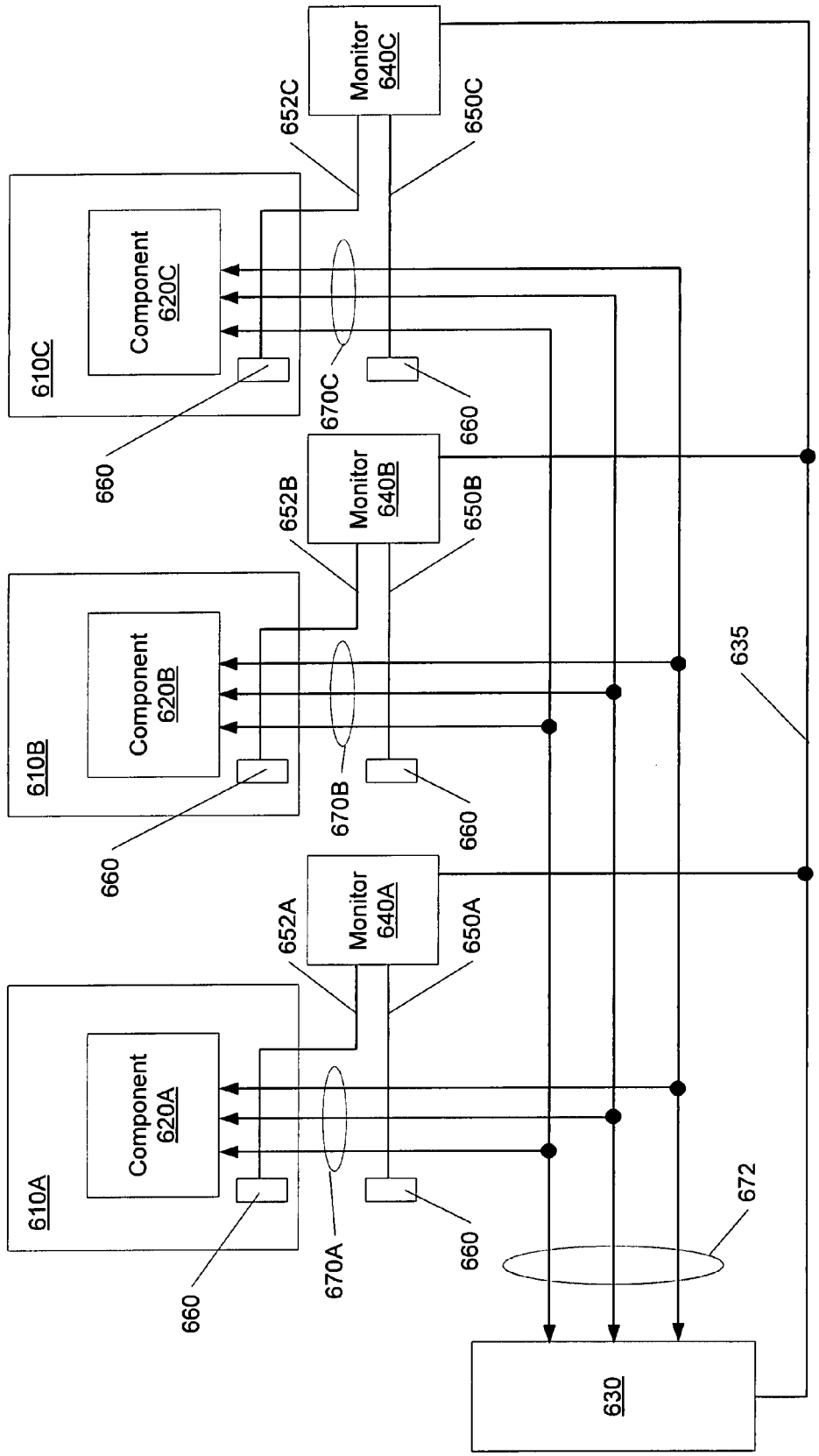
FIG. 6 illustrates a system with a multipoint bus topology.

FIG. 6 illustrates an embodiment wherein a single component 630 is coupled to multiple components 610A, 610B, and 610C. Each of components 610 may comprise a printed circuit board or other assembly. Each of components 610 in this example includes a component (e.g., a chip) configured to communicate with the single device 630. In the example shown, component 630 is configured to transmit and/or receive signals via three paths 672, each of which is coupled each of the components 620. In this case, a separate monitoring components 640A-640C is shown for monitoring signals corresponding to a given components. For example, monitoring component 640A includes sense lines 650A and 652A coupled to functional lines 670A, monitoring component 640B includes sense lines 650B and 652B coupled to functional lines 670B, and monitoring component 640C includes sense lines 650C and 652C coupled to functional lines 670C. Also shown is a reference signal(s) 635 coupling component 630 to each of monitoring components 640A-640C. In an alternative embodiment, reference signals may be generated internally by components 640. As each assembly 610A-610C includes its own monitoring component 640A-640C, a signal line failure may be narrowed to both a particular assembly 610, and a portion of the transmission paths corresponding to a particular assembly. As used herein, a reference numeral followed by a letter may refer to one of two or more similarly configured components. A single reference numeral may at times be used to refer to the components collectively. For example, components 640A-640C may collectively be referred to as components 640.

Figure 7:
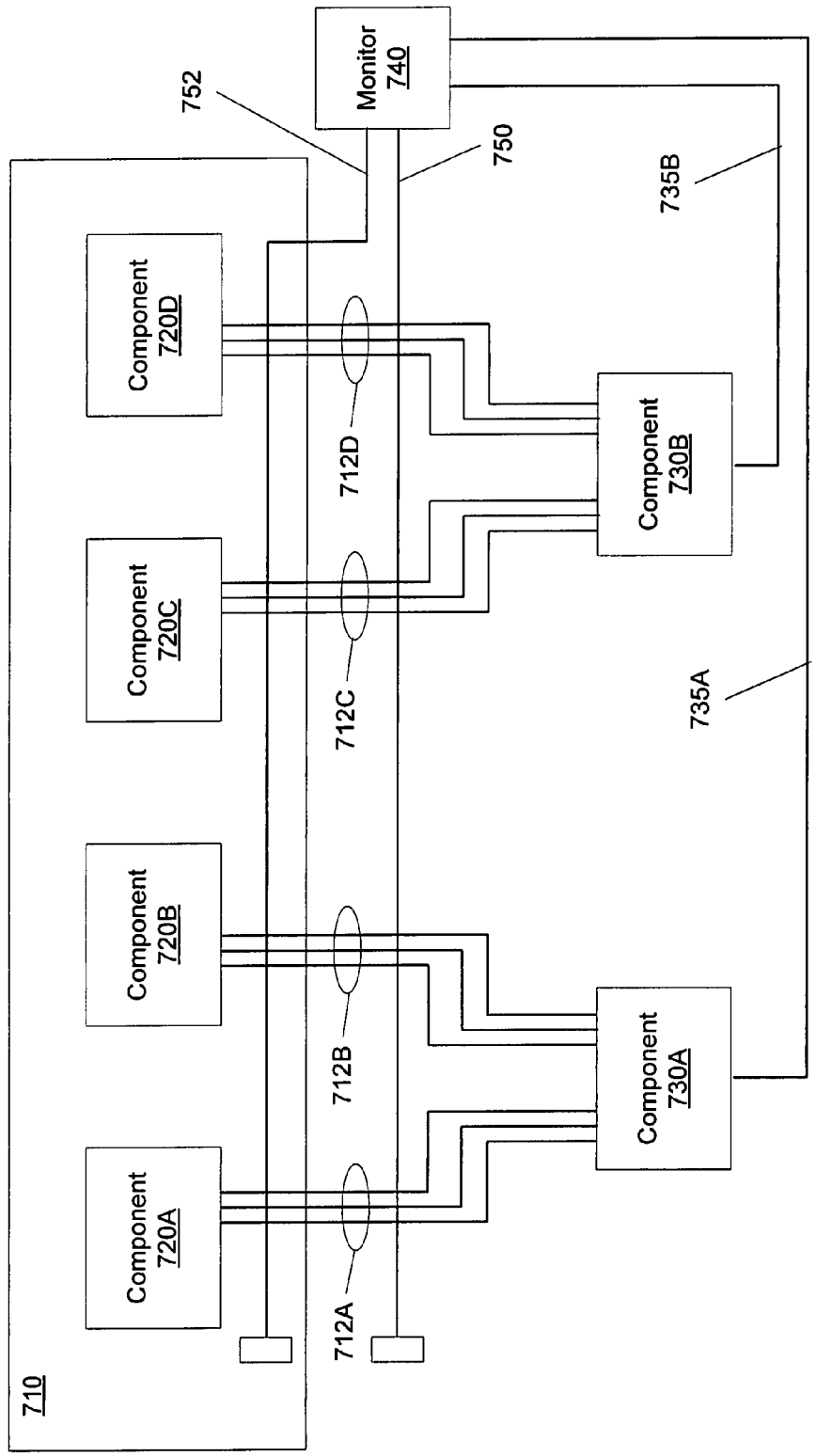
FIG. 7 illustrates a system with multiple driving and receiving devices.

Alternatively, FIG. 7 depicts an embodiment wherein a single component 740 may be configured to monitor paths to/from any number of devices. As shown in FIG. 7, a single monitoring component 740 is coupled to monitor signals between components 730A-730B and 720A-720D. In this example, each component 730 is coupled to communicate with two components. For example, component 730A is coupled to component 720A via path 712A, and component 720B via path 712B. Component 730B is coupled to component 720C via path 712C, and is coupled to component 720D via path 712D. Components 720A-720D are shown to be part of a single larger assembly 710, though this is not required.

As shown, the single monitoring component 740 include a sense line 752 and sense line 750 which crosses paths 712A-712D. In addition, component 730A is coupled to convey a reference signal 735A to monitoring component 740, and component 730B is coupled to convey a reference signal 735B to monitoring component 740. As each of sense lines 750 and 752 are coupled to multiple functional signal lines in this example, testing may include selecting a single component 730A or 730B to conduct a test at a given time. The selected component 730 may then test a single line at a time. Alternatively, as described above, multiple signal lines may be tested at a time by using different frequencies or other characteristics for the test signals. In addition, reference signals 735 may be internally generated by component 740.

Figure 8:
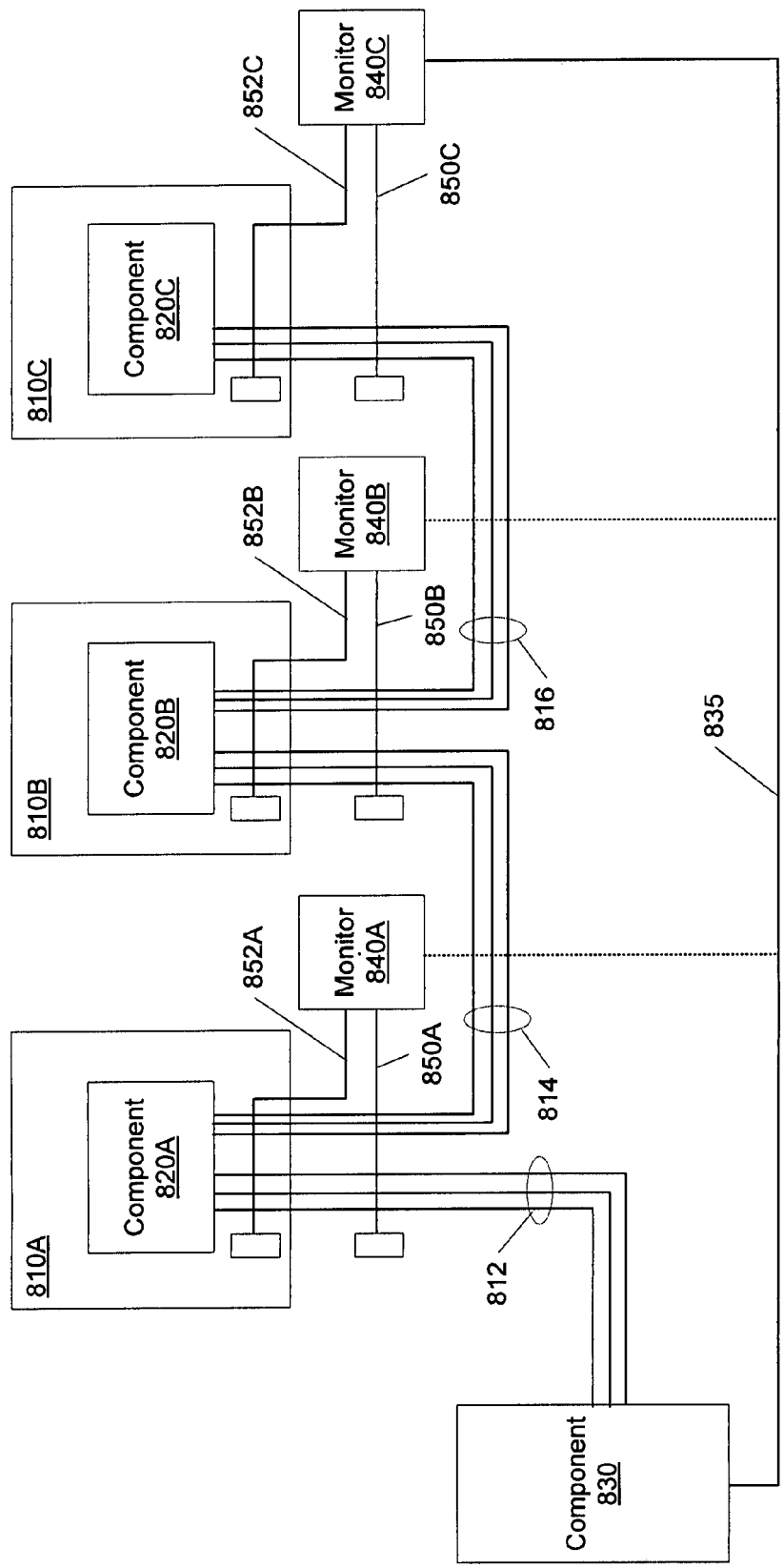
FIG. 8 illustrates a system with a daisy chain topology.

FIG. 8 illustrates an embodiment wherein a daisy chain topology is utilized. In this example, a component 830 is coupled to a first assembly 810A including a component 820A via signal path 812. Assembly 810A is then coupled to a second assembly 810B and component 820B via path 814. Finally, assembly 810B is coupled to assembly 810C and component 820C via path 816. In addition, three monitoring components 840A-840C are shown, each being configured to monitor signal paths for a corresponding assembly. Component 830 is coupled via reference signal 835 to each of monitoring components 840. In an alternative embodiment, reference signal 835 may be generated internally by components 840.

In the example, of FIG. 8, component 830 is configured to convey test signals via path 812. Such test signals may then be forwarded by each receiving component to a next component. For example, component 830 may convey test signals for the purpose of testing signal path 816. Accordingly, such test signals would be conveyed via path 812 to assembly 810A, from assembly 810A via path 814 to assembly 810B, the from assembly 810B via path 816. Alternatively, one or more of components 820 may be configured to convey a test signal.

As shown, each of monitoring components 840 are configured to monitor signals corresponding to a given assembly. So, for example, component 830 may convey a test signal which is intended to traverse each of paths 812, 814, and 816. Each of monitoring components 840 may then monitor their respective paths for the test signal. If both monitoring components 840A and 840B detect the test signal, but monitoring component 840C does not, then a fault in path 816 may be indicated.

Figure 9:
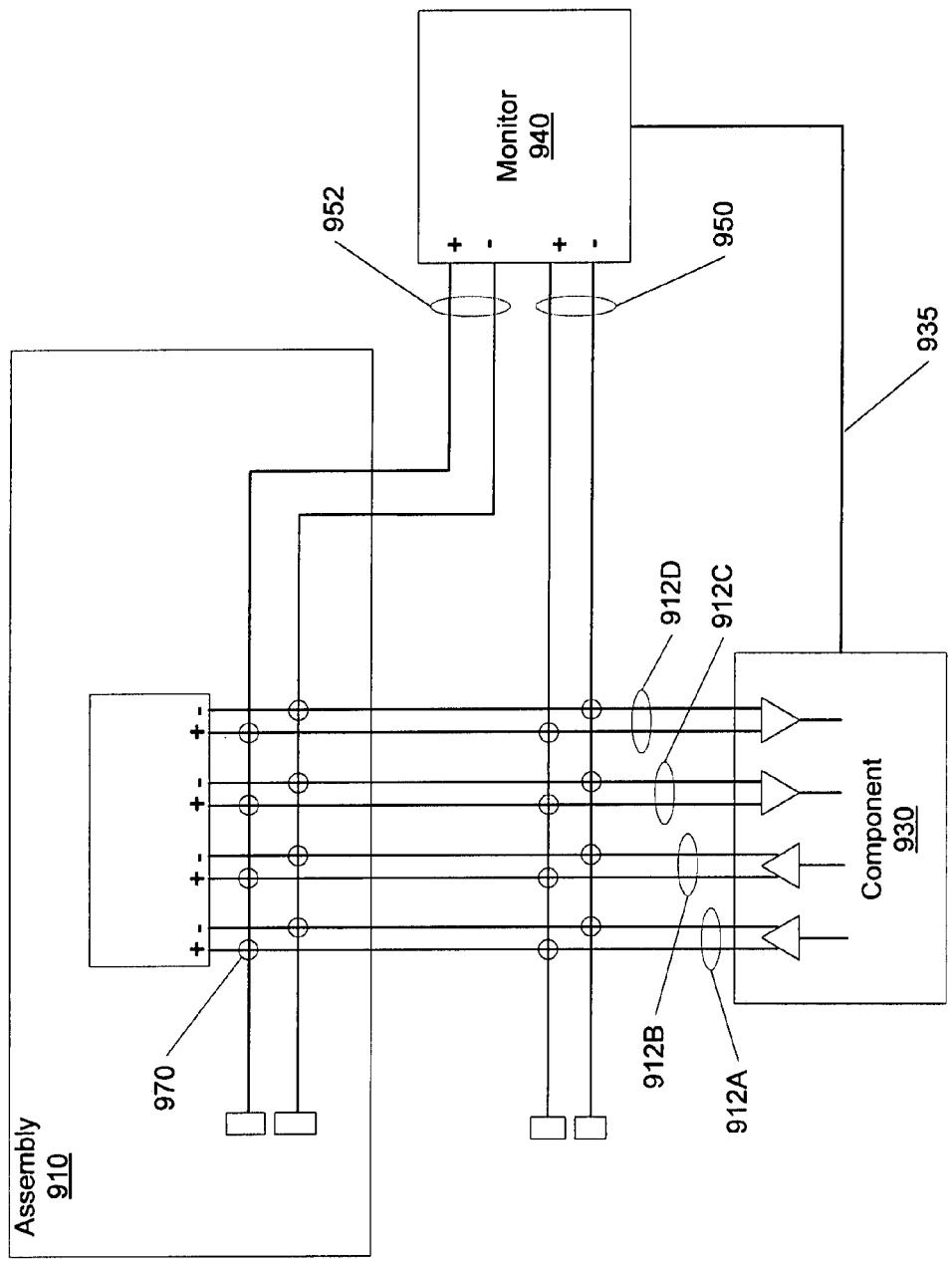
FIG. 9 illustrates a system utilizing differential signal paths.

FIG. 9 depicts one embodiment wherein differential signaling is used in the functional path. In such an embodiment, step must generally be taken to avoid coupled signal cancellation. In such an embodiment, transmission paths 912A-912D between component 930 and assembly 910 comprise differential signals. Sense signals 950 and 952 are coupled to monitoring component 940. As before, a reference signal 935 may be used between component 930 and monitoring component 940. Circles on signal lines, such as circle 970, indicate points of increased or preferential coupling. In various embodiments, the sense signals 950 and 952 may comprise regions of increased coupling area to preferentially couple to either the positive or negative functional signal trace of a differential signal path. Numerous such alternative configurations are possible and are contemplated.

While the above description only makes reference to test signals, in certain embodiments, low amplitude test signals may be injected on functional signal lines while the system is in normal operation and still be reliably detected by a monitoring component. In such an embodiment, it may be necessary to take measurements which are averaged over longer intervals than may otherwise be the case.

Numerous variations and modifications will become apparent to those skilled in the art once the above disclosure is fully appreciated. It is intended that the following claims be interpreted to embrace all such variations and modifications. For example, monitoring components may be configured to measure a test signal's spectral content and look for correct amplitude and harmonic content. Further, methods and mechanisms described herein may be applied to other than electrical domains, such as optical, chemical, fluid, or other domains with the appropriate substitution of technology.

What is claimed is:

1. A system for testing a transmission path, the system comprising:
   a first component coupled to at least a second component via a signal path, the signal path including one or more functional signal traces, wherein the signal path comprises a differential signal path;
   a monitoring component; and
   one or more sense signal lines coupled as inputs to the monitoring component;
   wherein the one or more sense signal lines are configured to redirect through parasitic coupling a portion of one or more signals conveyed via the signal path to the monitoring component; and
   a reference signal, wherein the reference signal is internally generated by the monitoring component or is received by the monitoring component on a path that is separate from the signal path, and wherein the reference signal is indicative of a test signal conveyed via the signal path;
   wherein the monitoring component is configured to:
   detect said one or more redirected signals; and
   compare characteristics of said one or more detected redirected signals to expected values.

2. The system as recited in claim 1, wherein at a point of close proximity between a sense signal line of the signal lines and a functional signal trace of the traces, the sense signal line is manufactured in a deliberate manner to have an area of proximity to the functional trace signal.

3. The system as recited in claim 1, wherein the monitoring component is configured to multiply a received redirected signal with a reference frequency to produce a resulting signal, filter the resulting signal to obtain a filtered signal, and detect an amplitude of the filtered signal.

4. The system as recited in claim 1, wherein the first component is configured to encode a test signal transmitted via the signal path with a pseudo random noise code, and wherein the monitoring component is configured to receive a redirected signal corresponding to the encoded test signal, and utilize a replica of the pseudo noise code to extract components of the test signal from the redirected signal.

5. The system as recited in claim 1, wherein the first component is configured to concurrently transmit a first test signal via a first functional signal trace of the traces, and a second test signal via a second functional signal trace of the traces, wherein the first test signal is a different frequency or pseudo-code than that of the second test signal.

6. The system as recited in claim 1, wherein the system is configured to convey a low level test signal via the signal path during ordinary system operation.

7. The system as recited in claim 1, wherein the one or more sense signal lines are connected to a substrate or ground plane.

8. A method for testing a transmission path, the method comprising:
conveying a test signal via a signal path including one or more functional signal traces, wherein a reference signal is aligned with the test signal, wherein the test signal comprises a differential signal path;
coupling a sense signal line to redirect a portion of a test signal carried by the signal path;
detecting the redirected portion of the test signals;
comparing characteristics of the redirected portion of the test signals to expected values; and
determining a location of a fault responsive to said detecting.

9. The method as recited in claim 8, and said comparing is performed by a monitoring component, and wherein the reference signal is either internally generated by the monitoring component or received by the monitoring component from an external source.

10. The method as recited in claim 9, further comprising multiplying the redirected portion with a reference frequency to produce a resulting signal, filtering the resulting signal to obtain a filtered signal, and detecting an amplitude of the filtered signal.

11. The method as recited in claim 8, further comprising manufacturing the sense signal line such that at a point of close proximity between the sense signal line and a functional signal trace, the sense signal line is manufactured in a deliberate manner to have an area of proximity to the functional trace signal.

12. The method as recited in claim 8, further comprising concurrently transmitting a first test signal via a first functional signal trace of the traces, and a second test signal via a second functional signal trace of the traces, wherein the first test signal is a different frequency or pseudo-noise sequence than that of the second test signal.

13. The method as recited in claim 8, wherein said test signal is conveyed during ordinary system operation.

14. The method as recited in claim 13, wherein the test signal comprises a low level signal which is conveyed while the signal path is in use.

15. The method as recited in claim 8, wherein the sense signal line comprises regions of increased coupling area to preferentially couple to either a positive or negative functional signal trace.

16. A system comprising:
a first assembly comprising a first component and a connector, the first component being coupled to the connector via first functional signal traces, the first signal traces comprising a differential signal path;
a second component coupled to the connector via second functional signal traces; and
a monitoring component coupled to a first sense signal line which crosses the first functional signal traces, and a second sense signal line which crosses the second functional signal traces;
wherein the first sense signal line is configured to redirect a portion of a signal conveyed via the first functional signal traces using parasitic coupling, and the second signal trace is configured to redirect a portion of a signal conveyed via the second functional signal traces; and
wherein the monitoring component is configured to compare said redirected signals to a corresponding reference signal; and
wherein the reference signal is internally generated by the monitoring component or is received by the monitoring component on a path that is separate from the first and second functional signal traces.

17. The system as recited in claim 16, wherein the monitoring component is configured to receive a redirected portion of a test signal via a sense signal line, multiply the redirected portion with a reference frequency or pseudo-noise to produce a resulting signal, filter the resulting signal to obtain a filtered signal; and detect an amplitude of the filtered signal.

* * * * *